US006892740B2

(12) United States Patent
Khoon

(10) Patent No.: US 6,892,740 B2
(45) Date of Patent: May 17, 2005

(54) METHOD AND APPARATUS FOR TRANSFERRING CHIPS

(76) Inventor: Teh Kean Khoon, 78-17-01, Marina Bay, Tanlong Tokong, 10470 Penang (MY)

( * ) Notice: Subject to any disclaimer, the term of this patent is extended or adjusted under 35 U.S.C. 154(b) by 510 days.

(21) Appl. No.: 10/152,973

(22) Filed: May 20, 2002

(65) Prior Publication Data

US 2003/0136432 A1 Jul. 24, 2003

(30) Foreign Application Priority Data

Jan. 22, 2002 (MY) ........................................ PI 20020237

(51) Int. Cl.[7] ................................................ B08B 3/02
(52) U.S. Cl. ........................ 134/64 R; 134/66; 134/902; 134/133; 414/222.01
(58) Field of Search ........................... 134/122 R, 64 R, 134/94.1, 902, 63, 66, 133, 418, 418.6; 414/222.01

(56) References Cited

U.S. PATENT DOCUMENTS

| | | | | | |
|---|---|---|---|---|---|
| 4,015,615 | A | * | 4/1977 | Weber et al. ................ | 134/196 |
| 4,550,239 | A | * | 10/1985 | Uehara et al. ......... | 219/121.43 |
| 5,394,609 | A | * | 3/1995 | Ferguson et al. ............. | 29/840 |
| 5,632,438 | A | * | 5/1997 | Hoffmeyer et al. ...... | 228/180.5 |
| 6,234,321 | B1 | * | 5/2001 | O'Connor et al. .......... | 209/539 |
| 6,592,680 | B2 | * | 7/2003 | Christison et al. ............ | 134/26 |
| 6,769,963 | B2 | * | 8/2004 | Mitsui et al. .................. | 451/41 |
| 2002/0134408 | A1 | * | 9/2002 | Christison et al. ............ | 134/26 |
| 2003/0102016 | A1 | * | 6/2003 | Bouchard .................... | 134/32 |

FOREIGN PATENT DOCUMENTS

| JP | 11-168006 | * | 6/1999 | | |
|---|---|---|---|---|---|
| MY | PI20020237 | | 4/2002 | | |

* cited by examiner

Primary Examiner—Frankie L. Stinson
(74) Attorney, Agent, or Firm—Donald R. Boys; Central Coast Patent Agency, Inc.

(57) ABSTRACT

A chip handling system for integrated circuit (IC) chips each having circuitry on a first face, has a delivery station for receiving, from a first transfer device, a row and column array of chips with the first face upward, a second transfer device enabled to move chips row-by-row across the delivery station from a first side to a second side, a delivery path aligned with a row of chips at the second side of the delivery station, a first linear transfer mechanism for moving a row of chips at the second side of the delivery station into and along the delivery path, a rotary transfer device having platforms arranged around a central axis, each platform having a groove parallel to the central axis for accepting rows of chips on each platform, and a drive rotating the device in angular increments to align the grooves with the delivery path, an elongate track and a second linear transfer mechanism located at a position relative to the rotary transfer device 180 degrees from the first delivery path, for receiving rows of chips from the grooves in the platforms of the rotary transfer device, an output tray for holding an array of rows and columns of chips in the same array as in the delivery station, a third transfer device enabled to transfer rows of chips from the elongate track to individual rows of the output tray, a delivery arm enabled to pick up a column of chips in a line at a right angle to the rows of the output tray, the number picked up equal to the number of rows in the output tray, and to move the column past an inspection station for inspecting one chip at a time, and a packaging station for receiving chips from the delivery arm. In an alternative embodiment an indexing turret collects chips from the elongate track and presents them to an inspection station.

18 Claims, 2 Drawing Sheets

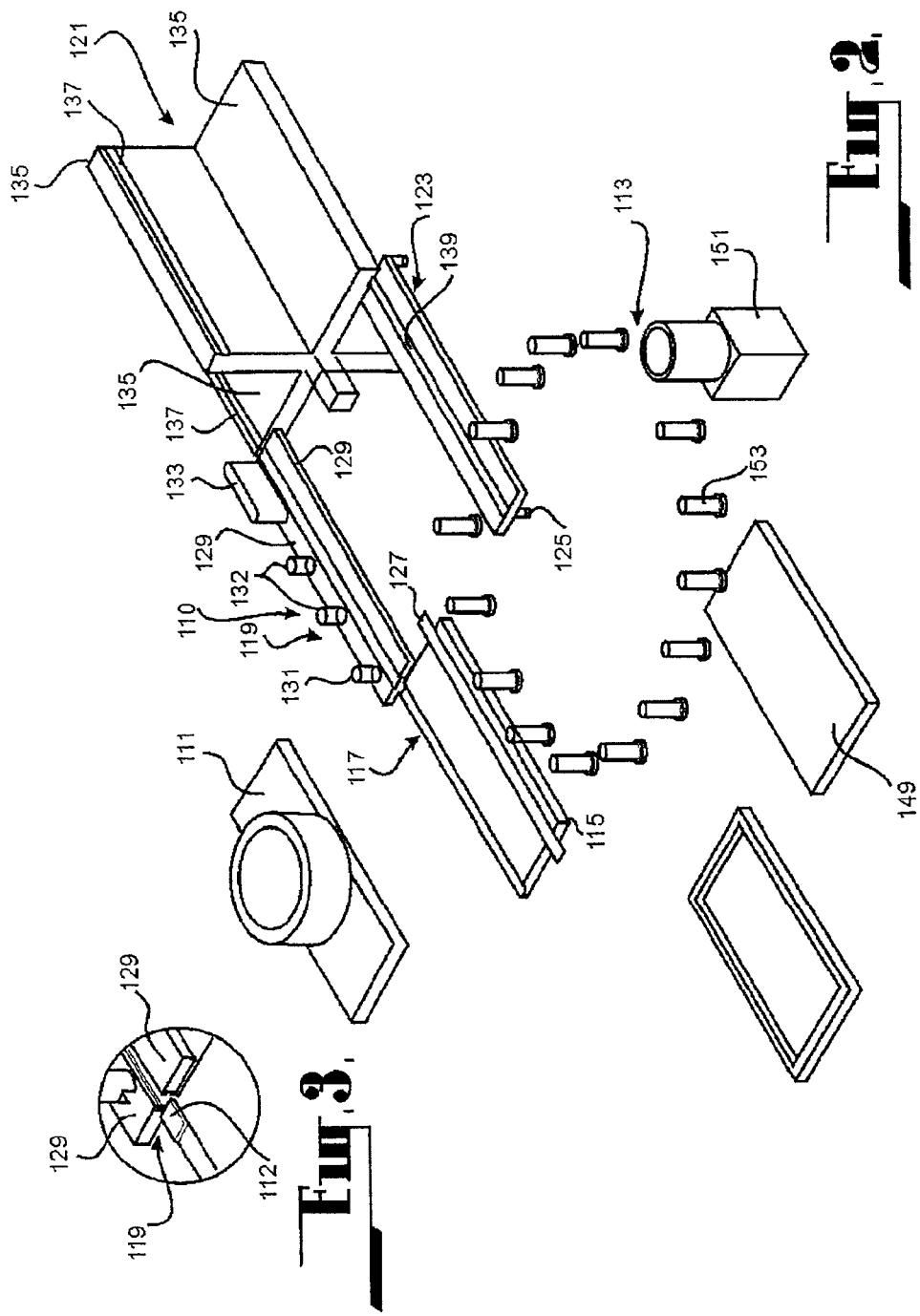

METHOD AND APPARATUS FOR TRANSFERRING CHIPS

FIELD OF THE INVENTION

This invention is in the field of apparatus and methods for handling and transferring integrated circuit chips, and in particular relates to such apparatus and methods for transferring separated chips from a cutting station to a checking station.

BACKGROUND OF THE INVENTION

In the manufacture of integrated circuit chips it is an established practice that arrays of chips are formed together on a single substrate, which is often termed a wafer in the art. In general, each chip is formed with a circuit array on one face and the substrate is diced or cut by a suitable apparatus in order to separate the individual chips from one another.

Throughout this specification reference to an integrated circuit chip shall be taken as a integrated circuit chip formed from a suitable semiconductor substrate, where the circuit is formed on one face and/or within the material of the substrate adjacent to one face, and the term circuit array shall be taken as the electrical circuit of an integrated circuit chip which is formed on and/or within that one face. It will therefore be appreciated that in the case of a ball grid array type of integrated circuit chip, the term "circuit array" of the chip will be taken to mean the face containing the ball grid array.

In the past difficulties have existed in efficiently and cost-effectively transferring cut (diced) chips from the dicing station to an output, while accurately maintaining position of the chips throughout the transfer process to prevent misalignment of the chips at the output. It is important that the chips be presented to the output in a predetermined position and with the circuit array accessible, to enable an adequate visual inspection of the individual chips prior to packaging.

One practice in the known art has been to apply an adhesive tape to the non-circuit face of the substrate prior to dicing, and then on completion of the dicing process to remove the chips from the tape. This procedure, however, has presented difficulties in the past, which difficulties are disclosed in U.S. Pat. No. 6,187,654 and U.S. Pat. No. 6,165,232, both incorporated in the present application by reference. An alternative procedure in the known art, as proposed in U.S. Pat. No. 6,187,654 and U.S. Pat. No. 6,165,232, also incorporated herein by reference, is to provide a nest which is utilized to support the substrate during the cutting process and to subsequently support the separated chips on completion of the cutting process to enable the chips to be washed, dried and delivered to the output. A difficulty with the use of nests as disclosed in these patents relates to the delay that occurs in the transfer of the chips from the dicing means to the output which transfer includes the washing of the chips within the nest and subsequently inspecting the resultant chips. This delay is primarily due to the use of the nests. In addition, each nest presents a significant capital expense which limits the number of nests which can be utilized at any one time. Moreover, chips of different physical size and aspect require different nests. Furthermore, the nests can be readily damaged in the dicing process, which requires replacement of the nest with the consequent capital costs.

SUMMARY OF THE INVENTION

In a preferred embodiment of the present invention a chip handling system for integrated circuit (IC) chips each having circuitry on a first face is provided, comprising a delivery station for receiving, from a first transfer device, a row and column array of chips with the first face upward, a second transfer device enabled to move chips row-by-row across the delivery station from a first side to a second side, a delivery path aligned with a row of chips at the second side of the delivery station, a first linear transfer mechanism for moving a row of chips at the second side of the delivery station into and along the delivery path, a rotary transfer device having platforms arranged around a central axis, each platform having a groove parallel to the central axis for accepting rows of chips on each platform, and a drive rotating the device in angular increments to align the grooves with the delivery path, an elongate track and a second linear transfer mechanism located at a position relative to the rotary transfer device 180 degrees from the first delivery path, for receiving rows of chips from the grooves in the platforms of the rotary transfer device, an output tray for holding an array of rows and columns of chips in the same array as in the delivery station, a third transfer device enabled to transfer rows of chips from the elongate track to individual rows of the output tray, a delivery arm enabled to pick up a column of chips in a line at a right angle to the rows of the output tray, the number picked up equal to the number of rows in the output tray, and to move the column past an inspection station for inspecting one chip at a time, and a packaging station for receiving chips from the delivery arm.

In a preferred embodiment there are washing and drying apparatus implemented along the delivery path, for cleaning chips as they move along the delivery path. The washing and drying apparatus comprise at least one water spray station, and at least one air blowing station, for washing and drying chips. In some cases the water spray apparatus and air dry apparatus are implemented along the delivery path both above and below the chips. Further, there may be at least one hot air station for drying chips.

In a preferred embodiment separated chips are maintained in position on the delivery station by vacuum elements creating a partial vacuum between a supporting surface of the station and the chips. Also in a preferred embodiment the delivery path is implemented by an opposed pair of spaced apart linear elements each having a groove to accommodate one edge of a chip. In some cases the platforms of the rotary transfer device are arranged around the central axis in increments of ninety degrees, and the index increment of the device is also ninety degrees. In some other cases the platforms of the rotary transfer device are arranged around the central axis in a degree increment that is equal to the index increment in degrees.

In another aspect of the invention a chip handling system for integrated circuit (IC) chips each having circuitry on a first face is provided, comprising a delivery station for receiving, from a first transfer device, a row and column array of chips with the first face upward, a second transfer device enabled to move chips row-by-row across the delivery station from a first side to a second side, a delivery path aligned with a row of chips at the second side of the delivery station, a first linear transfer mechanism for moving a row of chips at the second side of the delivery station into and along the delivery path, a rotary transfer device having platforms arranged around a central axis, each platform having a groove parallel to the central axis for accepting rows of chips on each platform, and a drive rotating the device in angular increments to align the grooves with the delivery path, an elongate track and a second linear transfer mechanism located at a position relative to the rotary transfer device 180 degrees from the first delivery path, for receiving rows of chips from the grooves in the platforms of the rotary transfer device, a turret having radially-spaced pickup heads positioned to receive chips one-by-one with subsequent indexes from the elongate track, an inspection station positioned such that chips picked up by the pickup heads of the turret are positioned at a subsequent index over the inspection station, and a laterally-moveable collection tray for collecting chips from the pickup heads in subsequent indexes of the turret after the inspection station.

In a preferred embodiment of this system there further washing and drying apparatus implemented along the delivery path, for cleaning chips as they move along the delivery path. The washing and drying apparatus comprises at least one water spray station, and at least one air blowing station, for washing and drying chips. In some cases water spray apparatus and air dry apparatus are implemented along the delivery path both above and below the chips, to clean the chips on both sides. Also in some cases there is at least one station with heated air.

In preferred embodiments separated chips are maintained in position on the delivery station by vacuum elements creating a partial vacuum between a supporting surface of the station and the chips. Also in preferred embodiments the delivery path is implemented by an opposed pair of spaced-apart linear elements each having a groove to accommodate one edge of a chip.

In some embodiments the platforms of the rotary transfer device are arranged around the central axis in increments of ninety degrees, and the index increment of the device is also ninety degrees, while in other embodiments the platforms of the rotary transfer device are arranged around the central axis in a degree increment that is equal to the index increment in degrees.

The invention will be more fully understood in the light of the following enabling description of several specific embodiments.

BRIEF DESCRIPTION OF THE DRAWINGS

FIG. 2 is a schematic illustration of the chip transfer system according to a second preferred embodiment.

FIG. 3 is an enlarged schematic view of an entrance to a washing and drying station in the embodiments shown in FIGS. 1 and 2.

DETAILED DESCRIPTION OF PREFERRED EMBODIMENTS

Figure 1:
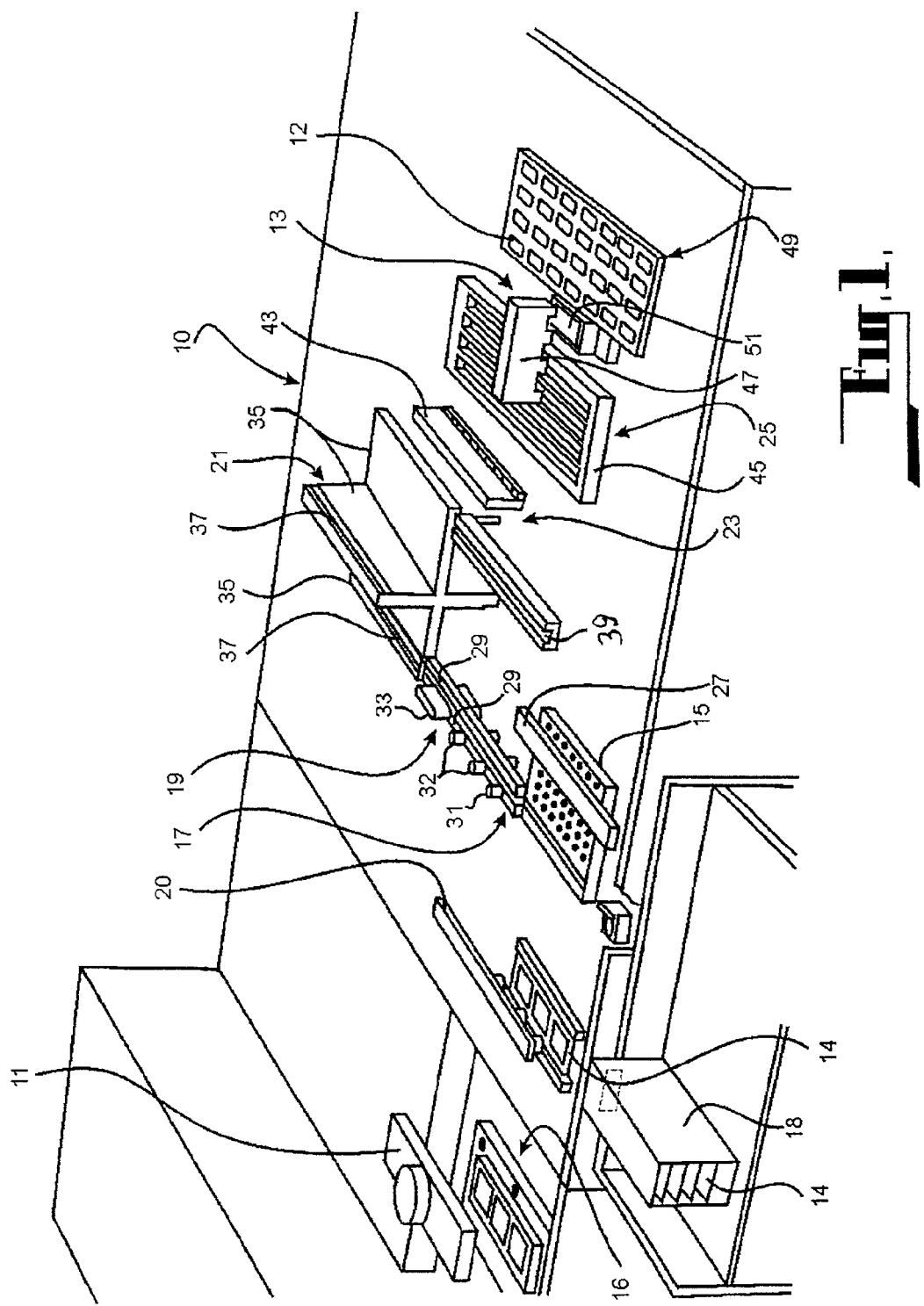
FIG. 1 is a schematic illustration of the chip transfer system according to a first preferred embodiment of the invention.

In a first preferred embodiment, illustrated in FIG. 1, chip transfer system 10 comprises integrated apparatus which is utilized to receive separated chips from a support 11 which is used to support and transfer a set of diced integrated circuit chips 12, which have been formed in a substrate 14 and then separated from each other at a dicing station 16. Chip transfer system 10 is configured to deliver the chips on an individual basis in a predetermined orientation to a collection and checking station 13, and finally to a packaging station 49.

Prior to arrival at chip handling system 10 the substrates 14 into which an array of integrated circuit chips have been formed are stored in a magazine 18 with the circuit arrays of each chip uppermost. From the magazine a substrate is extracted by a substrate pick-up arm 20 which delivers the substrate to dicing station 16 at which the substrate is divided to individualize each chip. The diced set of chips is then extracted from dicing station 16 by support 11, which then delivers the set of chips to the chip handling system 10.

Both substrate pick-up arm 20 and support 11 have a pick-up face which is formed of a flexible and resilient compressible material such as rubber, polyurethane or a like material, and has an array of holes which are connected to an air extraction device, whereby the pick-up face, when placed over the substrate or array of diced chips, respectively, will hold the substrate or set of chips respectively in position on the pick-up face.

The chip handling system 10 comprises a delivery station 15, a delivery path 17 located to one side of the delivery station 15, which incorporates a washing and drying station 19, a rotary transfer device 21 associated with the delivery path 17, and a delivery apparatus 23 associated with rotary transfer device 21, for delivering chips to an output 25, to which the chips are delivered one-by-one for collection by collection and transfer apparatus 13, which includes an inspection station for inspecting each chip prior to the chip being packaged.

Delivery station 15 comprises a substantially planar surface which is provided with an array of holes connected to a manifold associated with an air extraction device, whereby, on delivery of a set of separated chips to delivery station 15 by locating support 11 on the delivery station and activation of the air extraction device associated with the delivery station, the array of separated chips are positioned and supported on the delivery station.

Delivery station 15 is associated with an elongate arm 27 which is supported in association with delivery station 15 and in parallel relationship to delivery path 17 at the opposed side of delivery station 15 from delivery path 17. Elongate arm 27 is moveable transversely across the delivery station 15 in the direction of delivery path 17. A drive (not shown) for causing movement of elongate arm 27 across delivery station 15 provides for an indexed movement of arm 27, whereby the movement of arm 27 causes the set of chips supported on delivery station 15 to be moved transversely across delivery station 15 towards delivery path 17, such that the chips are delivered in a row-by-row fashion to delivery path 17. Delivery path 17 is associated with a first conveying mechanism (not shown) which is moveable axially along the delivery path to cause a row of chips resident in delivery path 17 to move along the delivery path.

As described previously, the delivery path is associated with a washing and drying station 19 into which the row of chips are conveyed by the first conveying mechanism. Delivery path 17 comprises a pair of laterally spaced guide members 29 which each have a groove formed in their opposed faces, for guiding chips in delivery path 17 past washing and drying station 19. Members 29 are spaced apart a sufficient distance to enable the chips to be received in the opposed grooves of members 29, and as a result be supported between the members. The opposed grooves in members 29 are configured to receive the chips at their opposed edges and permit slidable movement of the chips along the space between the members as a result of the influence of the conveying mechanism, that is, along delivery path 17.

Washing and drying station 19 in this example comprises separate washing and drying positions arranged along delivery path 17. There is firstly a washing position 31 which comprises a water spray nozzle which is connected to source of distilled or deionised water, whereby the nozzle is positioned to direct a spray of water onto the chips being conveyed along path 17 defined between members 29. The washing and drying station further comprises a pair of longitudinally spaced air positions 32 wherein ducts are positioned to direct a stream of unheated air onto the chips to clear at least some of the water from the chips that remains from washing position 31. In addition, the washing and drying means comprises a hot air position 33 comprising a duct connected to a source of heated air, and which is located downstream from the cold air positions 32. Warm air at position 33 is directed over the chips being conveyed along path 17 in order to dry the washed chips. In addition, a corresponding set of water nozzle, cold air ducts and heated air duct to that described above is positioned beneath path 17, to wash and dry passing chips on the underneath side.

Path 17 delivers washed and dried chips to rotary transfer device 21. Transfer device 21 comprises a plurality of platforms 35 arranged around and supported from a central axis to define a circular array rotatable about the central axis. The drive (not shown) for the transfer device causes the device to rotate, whereby on each activation of the drive each platform is caused to rotate through 90°. Each platform is provided with an elongate recess 37 which is dimensioned to receive each row of chips delivered from delivery path 17 after chips are washed and dried.

In FIG. 1 rotary device 21 is shown having four platforms 35 arranged around the central axis in ninety degree increments, and the drive is described as rotating the device in ninety degree increments as well. In this embodiment the elongate recesses are all sized for a particular chip size and geometry. In an alternative embodiment there may be additional platforms 35 having elongate grooves 37 sized for an alternative chip size and geometry. For example, there could be eight platforms 35 arranged around the central axis in 22.5 degree increments, with four of the platforms having grooves for one chip and the other four for a different chip. The platforms with different grooves are alternated around the axis of device 21, such that one may use either set of four by ninety degree rotation. In this way one device 21 may be used to serve two different chips. Further platforms properly arranged, could server yet another chip.

Transfer device 21 is further associated with an elongate track 39 which is positioned to be aligned with the elongate recess 37 of any one of platforms 35 as device 21 rotates and stops. Each index of device 21 is through 90 degrees, so after two indexes a row of chips which entered from path 17 is inverted, and aligned to be delivered to elongate track 39, which is a part of a delivery apparatus 23. Upon a row of chips being delivered from path 17 to recess 37 of a platform 35, the drive for the transfer means is activated to cause the platform to be indexed through 90°.

Delivery apparatus 23 further comprises a second conveying mechanism (not shown) which causes a row of chips to be transferred from recess 37 of the respective platform 35 into track 39 of the delivery apparatus 23. In FIG. 1 track 39 is illustrated as a single track enabled to accept a single row of chips from one elongate groove 37 in a platform 35 of device 21. In an alternative embodiment there may be parallel tracks 39 for receiving more than one row of chips from device 21, and there may be a transverse drive to align the separate tracks 39 with grooves 37 of device 21.

Elongate track 39 is associated with an elongate pick-up arm 43 which is enabled to pick up a row of chips which has been delivered to the elongate track 39, to a tray 45, which is able to receive and support a number of such rows of chips in a parallel array. Tray 45 is associated with a delivery arm 47 which is enabled to pick up one chip from each row of chips supported on the tray, and to deliver the chips to a packaging station 49. Delivery arm 47 makes contact with the backside, or non-circuit side, of the chips, which have been inverted from their previous face-up orientation by the rotation of device 21.

On passage between tray 45 and packaging station 49 each chip is caused to pass over a visual inspection station 51. On passage over the visual inspection station 51 the circuit array of each chip, now facing down toward the inspection station, is inspected.

In operation support 11 delivers an array of diced chips to delivery station 15, typically in a complete array of rows and columns. Between deliveries from the dicing station, elongate arm 27 moves chips row by row toward the side of the delivery station aligned with path 17, where the first conveying mechanism moves chips row-by-row into delivery path 17 and past washing and drying station 19 into groove 37 of rotary transfer device 21. As each row of chips is conveyed into path 17 at a suitable rate to allow cleaning, a previous row enters a groove 37 o a platform 35. Also as each row enters a groove 37, device 21 indexes, bring another platform into position to accept another line of chips from track 17.

With each index of device 21, in full operation, a new line or row of chips arrives in position to align with elongate track 39, and a second linear transport moves the arriving row out of groove 37 into track 39. Pickup arm 43 is constrained to operate once for each index of device 21, to empty track 39 for arrival of a new row of chips, and to move a row into tray 45. A number of transfers of rows of chips equal in number to the number of rows in the array of delivery station takes place to empty the delivery station, then a next transfer of support 11 occurs to replenish the rows on delivery station 15.

At the outlet end, pickup arm 43 operates with each index of device 21 to fully stock tray 45. Once tray 45 is full, delivery arm 47 movable both along and across the rows of tray 45, picks up chips, moves them past inspection station 51, and deposits them in packaging station 49.

In an alternative embodiment of the present invention, illustrated largely in FIG. 2 and FIG. 3, a chip handling system 110 is utilized to receive separated chips from a support 111, analogous to support 11 in the embodiment of FIG. 1, which supports and transfers a set of diced integrated circuit chips through chip handing system 110 to a collection and checking apparatus 113.

On completion of the dicing step, the array of diced chips are picked up by support 111, which transports the diced array of chips to delivery station 115. A delivery path 117 located to one side of the delivery station, analogous to delivery path 17 in FIG. 1, incorporates a washing and drying station 119, a rotary transfer device 121 associated with the delivery path 117, and a delivery apparatus 123 for delivering the chips to an output 125 one-by-one for collection by the collection and checking apparatus 113, which includes a checking station 151 for inspecting each chip prior to the chip being packaged.

The system of FIG. 2 follows the description of FIG. 1 up to the point of the chips beings inverted by successive rotational indexes of device 121, analogous to device 21 of FIG. 1, after which the process differs from the first embodiment described with reference to FIG. 1 above.

Following the description of the first embodiment, delivery station 115 comprises a substantially planar surface which is provided with an array of holes which are connected to a manifold associated with an air extraction system whereby, on delivery of a set of separated chips to delivery station 115 by locating support 111 on the delivery station and activation of the air extraction means associated with the delivery station, the array of separated chips are positioned and supported on the delivery station.

The delivery station is associated with elongate arm 127, analogous to arm 27 of FIG. 1, which is supported in association with delivery station 115 and in parallel relationship to delivery path 117 at the opposed side of delivery station 115 from delivery path 117. The elongate arm is moveable transversely across delivery station 115 in the direction of delivery path 117. The drive (not shown) for causing the movement of elongate arm 127 across the delivery station provides for an indexed movement of the arm 127, which causes a set of chips supported on delivery station 115 to be moved transversely across delivery station 115 towards delivery path 117, such that the chips are delivered in a row-by-row fashion to delivery path 117. Delivery path 117 is associated with a first conveying mechanism which is moveable axially along the delivery path to cause a row of chips resident in the delivery path 117 to move along the delivery path.

As described above, the delivery path is associated with a washing and drying station 119 past which rows of chips are conveyed by the first conveying mechanism. The washing and drying station 119 comprises a pair of laterally spaced-apart members 129 which each have a groove formed in their opposed faces. Members 129 are spaced from each other a distance to enable the chips to be received in the opposed grooves of members 129 and as a result be supported between the members (see FIG. 3). The opposed grooves in the members 129 are configured to receive the chips at their opposed edges and permit slidable movement of the chips along the space between the members as a result of the influence of the conveying means.

Chips conveyed along path 117 pass washing and drying station 119, analogous to station 19 of FIG. 1, comprising a washing station 131 having a water spray nozzle which is connected to source of distilled or deionised water, with the nozzle positioned to direct a spray of water onto the chips being conveyed along the path defined between the members 129. Washing and drying station 119 further comprises a pair of longitudinally spaced stations 132 having cold air ducts which each direct a stream of unheated air onto the chips to clear at least some of the resident water from the chips. In addition, station 119 comprises a warm air station 133 having a duct which is connected to a source of heated air, and which is located downstream from the cold air station 132. Warm air station 133 is positioned to direct a flow of warm air over the chips being conveyed along path 117 in order to dry the washed chips. The water spray, cold air, and warm air apparatus is repeated on the underside of path 117 to wash and dry both sides of passing chips.

After washing and drying chips are delivered to rotary transfer device 121. Transfer device 121, the same as device 21 of FIG. 1, comprises a plurality of platforms 135 which are each supported from a central axis to define a circular array, with the transfer device rotatable about the central axis. The drive (not shown) for the transfer device causes rotation to occur in increments of 90°. Each platform is provided with an elongate recess 137 dimensioned to receive each row of chips being delivered from the delivery path 117. Transfer device 121, after two indexes, has inverted the position of the chips, with the circuit face now downward. An elongate track is positioned to be aligned with elongate recess 137 of platforms 135 at the two-index point.

As previously described for device 21 of FIG. 1, in FIG. 2 rotary device 121 is shown having four platforms 135 arranged around the central axis in ninety degree increments, and the drive is described as rotating the device in ninety degree increments as well. In this embodiment the elongate recesses are all sized for a particular chip size and geometry. In an alternative embodiment there may be additional platforms 135 having elongate grooves 137 sized for an alternative chip size and geometry. For example, there could be eight platforms 135 arranged around the central axis in 22.5 degree increments, with four of the platforms having grooves for one chip and the other four for a different chip. The platforms with different grooves are alternated around the axis of device 121, such that one may use either set of four by ninety degree rotation. In this way one device 121 may be used to serve two different chips. Further platforms properly arranged could serve yet another chip.

Delivery apparatus 123 further comprises a second conveying mechanism to cause a row of chips to be transferred from recess 137 of the respective platform 135 into track 139 of the delivery apparatus 123. In FIG. 2 track 139 is illustrated as a single track enabled to accept a single row of chips from one elongate groove 137 in a platform 135 of device 121. In an alternative embodiment there may be parallel tracks 139 for receiving more than one row of chips from device 121, and there may be a transverse drive to align the separate tracks 139 with grooves 137 of device 121.

The outer end, or exit end, of elongate track 139 is provided with an outlet 125 which receives each chip one-by-one, and this is the point that the architecture of the embodiment of FIG. 2 begins to depart from that shown in FIG. 1. The output is associated with collection and checking apparatus 113 such that each chip is then collected by the collection apparatus for visual checking by a visual inspection station 151, and for subsequent delivery to packaging station 149. The collection and checking apparatus comprises a turret (not shown) which supports a circular array of pick-up heads 153. The turret is caused to index rotationally, and thus cause the heads to sequentially index past the output station 125, at which they collect a chip and move on with each subsequent index of the turret.

As each chip is collected from output 125, the chip is in an inverted position, circuitry facing downward, whereby the circuit array of each chip may be inspected by visual inspection station 151.

The alternative embodiment described above, with regard to FIGS. 2 and 3, utilizing a rotary turret at the outlet of track 139, has an advantage in that chips are moved from the outlet track and inspected one-at-a-time, and placed in the output tray, which allows the overall apparatus to be used more efficiently.

The handling system according to each of the embodiments described above provides a system wherein the separated chips of a diced substrate can be extracted, cleaned, then conveyed to a checking apparatus wherein the integrity of each of the chips can be inspected without the need for tape as has been the previous practice, or utilization of a nest as has been proposed in U.S. Pat. Nos. 6,165,232 and No. 6,187,654.

Throughout the specification, unless the context requires otherwise, the word "comprise" or variations such as "comprises" or "comprising", will be understood to imply the inclusion of a stated integer or group of integers but not the exclusion of any other integer or group of integers. It should be appreciated that the scope of the present invention need not be limited to the particular scope of the embodiment described above, but that a variety of changes may be made to the described embodiments without departing from the spirit and scope of the invention. Accordingly, the scope of the invention is limited only by the claims recited below.

What is claimed is:

1. A chip handling system for integrated circuit (IC) chips each having circuitry on a first face, comprising:
   a delivery station for receiving, from a first transfer device, a row and column array of chips with the first face upward;
   a second transfer device enabled to move chips row-by-row across the delivery station from a first side to a second side;
   a delivery path aligned with a row of chips at the second side of the delivery station;
   a first linear transfer mechanism for moving a row of chips at the second side of the delivery station into and along the delivery path;
   a rotary transfer device having platforms arranged around a central axis, each platform having a groove parallel to the central axis for accepting rows of chips on each platform, and a drive rotating the device in angular increments to align the grooves with the delivery path;
   an elongate track and a second linear transfer mechanism located at a position relative to the rotary transfer device 180 degrees from the first delivery path, for receiving rows of chips from the grooves in the platforms of the rotary transfer device;
   an output tray for holding an array of rows and columns of chips in the same array as in the delivery station;
   a third transfer device enabled to transfer rows of chips from the elongate track to individual rows of the output tray;
   a delivery arm enabled to pick up a column of chips in a line at a right angle to the rows of the output tray, the number picked up equal to the number of rows in the output tray, and to move the column past an inspection station for inspecting one chip at a time; and
   a packaging station for receiving chips from the delivery arm.

2. The system of claim 1 further comprising washing and drying apparatus implemented along the delivery path, for cleaning chips as they move along the delivery path.

3. The system of claim 2 wherein the washing and drying apparatus comprises at least one water spray station, and at least one air blowing station, for washing and drying chips.

4. The system of claim 3 wherein water spray apparatus and air dry apparatus are implemented along the delivery path both above and below the chips.

5. The system of claim 3 wherein the air dry apparatus comprises at least one station with heated air.

6. The system of claim 1 wherein separated chips are maintained in position on the delivery station by vacuum elements creating a partial vacuum between a supporting surface of the station and the chips.

7. The system of claim 1 wherein the delivery path is implemented by an opposed pair of spaced apart linear elements each having a groove to accommodate one edge of a chip.

8. The system of claim 1 wherein the platforms of the rotary transfer device are arranged around the central axis in increments of ninety degrees, and the index increment of the device is also ninety degrees.

9. The system of claim 1 wherein the platforms of the rotary transfer device are arranged around the central axis in a degree increment that is equal to the index increment in degrees.

10. A chip handling system for integrated circuit (IC) chips each having circuitry on a first face, comprising:
    a delivery station for receiving, from a first transfer device, a row and column array of chips with the first face upward;
    a second transfer device enabled to move chips row-by-row across the delivery station from a first side to a second side;
    a delivery path aligned with a row of chips at the second side of the delivery station;
    a first linear transfer mechanism for moving a row of chips at the second side of the delivery station into and along the delivery path;
    a rotary transfer device having platforms arranged around a central axis, each platform having a groove parallel to the central axis for accepting rows of chips on each platform, and a drive rotating the device in angular increments to align the grooves with the delivery path;
    an elongate track and a second linear transfer mechanism located at a position relative to the rotary transfer device 180 degrees from the first delivery path, for receiving rows of chips from the grooves in the platforms of the rotary transfer device;
    A turret having radially-spaced pickup heads positioned to receive chips one-by-one with subsequent indexes from the elongate track;
    an inspection station positioned such that chips picked up by the pickup heads of the turret are positioned at a subsequent index over the inspection station; and
    a laterally-moveable collection tray for collecting chips from the pickup heads in subsequent indexes of the turret after the inspection station.

11. The system of claim 10 further comprising washing and drying apparatus implemented along the delivery path, for cleaning chips as they move along the delivery path.

12. The system of claim 11 wherein the washing and drying apparatus comprises at least one water spray station, and at least one air blowing station, for washing and drying chips.

13. The system of claim 12 wherein water spray apparatus and air dry apparatus are implemented along the delivery path both above and below the chips.

14. The system of claim 12 wherein the air dry apparatus comprises at least one station with heated air.

15. The system of claim 10 wherein separated chips are maintained in position on the delivery station by vacuum elements creating a partial vacuum between a supporting surface of the station and the chips.

16. The system of claim 10 wherein the delivery path is implemented by an opposed pair of spaced apart linear elements each having a groove to accommodate one edge of a chip.

17. The system of claim 10 wherein the platforms of the rotary transfer device are arranged around the central axis in increments of ninety degrees, and the index increment of the device is also ninety degrees.

18. The system of claim 10 wherein the platforms of the rotary transfer device are arranged around the central axis in a degree increment that is equal to the index increment in degrees.

* * * * *